(12) United States Patent
Desclos et al.

(10) Patent No.: US 9,035,836 B2
(45) Date of Patent: May 19, 2015

(54) SUPERIMPOSED MULTIMODE ANTENNA FOR ENHANCED SYSTEM FILTERING

(71) Applicant: Ethertronics, Inc., San Diego, CA (US)

(72) Inventors: Laurent Desclos, San Diego, CA (US); Sebastian Rowson, San Diego, CA (US); Jeffrey Shamblin, San Marcos, CA (US)

(73) Assignee: Ethertronics, Inc., San Diego, CA (US)

( * ) Notice: Subject to any disclaimer, the term of this patent is extended or adjusted under 35 U.S.C. 154(b) by 268 days.

(21) Appl. No.: 13/674,100

(22) Filed: Nov. 12, 2012

(65) Prior Publication Data

US 2013/0141293 A1    Jun. 6, 2013

Related U.S. Application Data

(63) Continuation-in-part of application No. 13/029,564, filed on Feb. 17, 2011, now Pat. No. 8,362,962, which is a continuation of application No. 12/043,090, filed on Mar. 5, 2008, now Pat. No. 7,911,402, application No. 13/674,100, which is a continuation-in-part of application No. 13/289,901, filed on Nov. 4, 2011, now Pat. No. 8,717,241, which is a continuation of application No. 12/894,052, filed on Sep. 29, 2010, now Pat. No. 8,077,116, which is a continuation of application No. 11/841,207, filed on Aug. 20, 2007, now Pat. No. 7,830,320.

(51) Int. Cl.
| | |
|---|---|
| *H01Q 9/38* | (2006.01) |
| *H01Q 9/06* | (2006.01) |
| *H01Q 1/24* | (2006.01) |
| *H01Q 3/00* | (2006.01) |
| *H01Q 9/04* | (2006.01) |

(52) U.S. Cl.
CPC ............. *H01Q 9/06* (2013.01); *H01Q 1/243* (2013.01); *H01Q 3/00* (2013.01); *H01Q 9/0421* (2013.01)

(58) Field of Classification Search
CPC .................................................... H01Q 3/00
USPC ................. 343/700 MS, 745, 815, 816, 834
See application file for complete search history.

(56) References Cited

U.S. PATENT DOCUMENTS

| | | | | |
|---|---|---|---|---|
| 6,326,921 | B1 * | 12/2001 | Egorov et al. | 343/700 MS |
| 6,429,818 | B1 * | 8/2002 | Johnson et al. | 343/702 |
| 6,614,400 | B2 * | 9/2003 | Egorov | 343/702 |
| 6,765,536 | B2 * | 7/2004 | Phillips et al. | 343/702 |
| 6,950,065 | B2 * | 9/2005 | Ying et al. | 343/700 MS |
| 7,081,854 | B2 * | 7/2006 | Ying et al. | 343/702 |

* cited by examiner

*Primary Examiner* — Tho G Phan
(74) *Attorney, Agent, or Firm* — Coastal Patent Law Group, P.C.

(57) ABSTRACT

In a typical system a combination of filters (BAW, SAW, etc) and an antenna are configured to achieve frequency filtering effect and efficient transmission and reception of communication signals. Wireless communication systems require specific bandwidth and out-of-band rejection; typically this metric is characterized in frequency roll-off in units of dB/MHz. This number is distributed between the antenna and filter, with the antenna contributing little to date to the filtering effect. Loss and cost penalties are incurred when multi-mode systems are designed which require additional rejection from the filter elements. Described here is a method of designing antennas to reduce the amount of rejection and complexity from the filter system. A superposition of a symmetrical frequency response from the antenna structure coupled with a non-symmetrical frequency response from a counterpoise structure generates increased rejection of out-of-band components.

7 Claims, 17 Drawing Sheets

Frequency response of multimode antenna with parasitic; asymmetric frequency response Parasitic element integrated into ground plane

SUPERIMPOSED MULTIMODE ANTENNA FOR ENHANCED SYSTEM FILTERING

CROSS-REFERENCE TO RELATED APPLICATIONS

This application is a CIP of U.S. Ser. No. 13/029,564, filed Feb. 17, 2011, and titled "ANTENNA AND METHOD FOR STEERING ANTENNA BEAM DIRECTION", which is a CON of U.S. Ser. No. 12/043,090, filed Mar. 5, 2008, titled "ANTENNA AND METHOD FOR STEERING ANTENNA BEAM DIRECTION", now issued as U.S. Pat. No. 7,911,402; and a CIP of U.S. Ser. No. 13/289,901, filed Nov. 4, 2011, titled "ANTENNA WITH ACTIVE ELEMENTS", which is a CON of U.S. Ser. No. 12/894,052, filed Nov. 29, 2010, titled "ANTENNA WITH ACTIVE ELEMENTS", now U.S. Pat. No. 8,077,116, which is a CON of Ser. No. 11/841,207, filed Aug. 20, 2007, titled "ANTENNA WITH ACTIVE ELEMENTS", now U.S. Pat. No. 7,830,320;

the contents of each of which are hereby incorporated by reference.

BACKGROUND OF THE INVENTION

1. Field of the Invention

The present invention relates to mobile communication devices and more particularly to an improved antenna and filter architecture for RF front end circuits to enhance communication system performance.

2. Description of the Related Art

As multimode systems become more common and as more frequency bands are added to communication systems filtering requirements become more complex and difficult. As more filtering is added the losses in the system increase, which in turn reduces communication range and data rate of transmitted signals, or required additional transmit power to overcome these increased losses.

A common problem encountered in mobile wireless communication systems is the de-tuning effects incurred on the antenna due to the multiple use cases for the device. As the antenna de-tunes, the impedance presented by the antenna to the power amplifier and receiver varies, which in turn reduces the power transfer through the front end (power amplifier, switch assembly, filters, and antenna). The result is reduced communication range as well as reduced data rate for the communication device. With a passive antenna and fixed impedance matching circuit, the front end can only be optimized for a single use case such as device held in the user's hand, device against the user's head, or placement of the device on a surface such as a table or dashboard of an automobile. The added requirement for the mobile wireless device to operate when connected to or in close proximity to additional accessories makes the task of keeping the antenna system optimized more of a challenge.

SUMMARY OF THE INVENTION

Accordingly, it is an object of the present invention to solve these and other problems in the art by providing a multimode antenna with symmetric and asymmetric frequency roll-off out of band to improve overall system filtering performance, and related methods.

In keeping with these objectives and with others which will become apparent hereinafter, an improved front end circuit design is provided, wherein an adaptive transceiver is used to boost both transmitted and received signal levels.

BRIEF DESCRIPTION OF THE DRAWINGS

FIG. 2b illustrates return loss and radiated efficiency of the antenna system of FIG. 2a.

DETAILED DESCRIPTION OF THE PREFERRED EMBODIMENTS

Figure 1A:
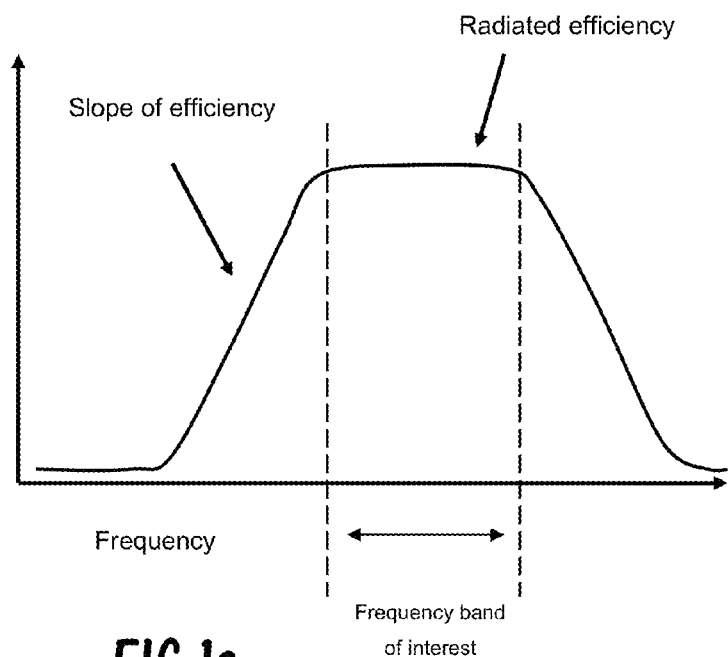
FIG. 1a illustrates a plot showing slope of efficiency and radiated efficiency of the antenna system of FIG. 1b.

In the following description, for purposes of explanation and not limitation, details and descriptions are set forth in order to provide a thorough understanding of the present invention. However, it will be apparent to those skilled in the art that the present invention may be practiced in other embodiments that depart from these details and descriptions.

Commonly owned, U.S. Pat. No. 7,911,402, titled "ANTENNA AND METHOD FOR STEERING ANTENNA BEAM DIRECTION", and U.S. Pat. No. 7,830,320, titled "ANTENNA WITH ACTIVE ELEMENTS", disclose antenna systems capable of beam steering, band switching, active matching, and other active tunable characteristics; the contents of each of which are hereby incorporated by reference. These antennas utilize a radiating element and one or more parasitic elements coupled to active elements in a manner for enabling switching, variable reactance, and other tuning of the antenna components. The resulting structure is an active tunable antenna capable of operating in multiple modes, otherwise termed an "active modal antenna" or "modal antenna". The referenced patents disclose active modal antennas and thus details of these structures will not be discussed in detail herein.

An "active modal antenna" as referred to herein includes an antenna capable of selective operation about a plurality of modes, wherein each of said plurality of modes generates a distinct antenna radiation pattern resulting from the first active modal antenna. In this regard, the active modal antenna can be reconfigured as necessary to provide an optimal radiation pattern. This is accomplished by one or more of: band-switching, beam steering, and active impedance matching as environmental effects detune the antenna. In representative examples, an active modal antenna comprises a radiating structure disposed above a circuit board and forming an antenna volume therebetween; a parasitic element positioned adjacent to the radiating structure; and an active element coupled to the parasitic element; wherein the active element is configured for one or more of: adjusting a reactance of the parasitic element, or shorting the parasitic element to ground.

As referenced herein, an "active element" may comprise at least one of: a voltage controlled tunable capacitor, voltage controlled tunable phase shifter, field-effect transistor (FET), tunable inductor, switch, or any combination thereof.

In certain embodiments, an antenna comprises an isolated magnetic dipole (IMD) element positioned above a ground plane; a parasitic element positioned beneath or next to the IMD element, with the parasitic connected to the ground plane; wherein the parasitic element is adjusted in length and positioned in relation to the IMD antenna to tune the frequency response of the IMD element to form an antenna that provides for transmission and reception of signals in the desired frequency band, and provides rejection of frequencies outside of the frequency band of interest; and wherein a symmetric frequency response is realized.

The frequency response of the parasitic is adjusted to merge with the frequency response of the IMD element to form a resultant asymmetric frequency response. The asymmetric frequency response provides a sharper roll-off in frequency response on one side of the resonant frequency compared to the other side.

In certain other embodiments, an antenna system comprises: an isolated magnetic dipole (IMD) element positioned above a ground plane; one or multiple parasitic elements; and an active tuning element connected to one or multiple parasitic elements, wherein the one or multiple parasitic elements and active elements are positioned around the said IMD element, a first port of the active tuning element is connected to a first end of the parasitic element, and a second port of the active tuning element is connected to the ground plane. The active tuning element is used to change the reactance at the parasitic at the connection point to the ground plane. This change in reactance affects a change in frequency of the IMD element. The frequency response of the IMD element is adjusted to the desired frequency of operation. The frequency response of the described antenna system provides for transmission and reception of signals in the desired frequency band, and provides rejection of frequencies outside of the frequency band of interest.

The frequency response of the parasitic is adjusted to merge with the frequency response of the IMD element to form a resultant asymmetric frequency response. The asymmetric frequency response provides a sharper roll-off in frequency response on one side of the resonant frequency compared to the other side.

In certain embodiments, the active tuning elements further comprise a switch, FET, MEMS device, or a component that exhibits active capacitive or inductive characteristics, or any combination of these components.

In several embodiments, the IMD element is modified to incorporate one or multiple active tuning elements to form an active antenna capable of tuning in frequency. An active tuning element can be integrated into a matching circuit at the antenna feed point, or an active tuning element can be attached to the ground leg of the IMD antenna element. An active tuning element can be attached to a conductive feature of the IMD element and connected to ground, or the active tuning element can be attached to the IMD element and configured to connect two portions of the IMD element or connect opposing sides of a slot section of the IMD element.

The antenna can be used in conjunction with an active tunable filter. The combination of active antenna system and active tunable filter is designed to provide the desired roll-off in the frequency domain for RF signal rejection. Control signals from baseband or processor in the communication system provide signals to optimize the tunable filter and active antenna. The combination of active antenna system and active tunable filter provides increased rejection of un-wanted frequency components, or can be optimized to minimize insertion loss through the filter by reducing frequency rejection requirements for the filter.

The antenna system may comprise a full ground plane beneath the IMD element. Alternatively, the ground plane is partially or completely removed beneath the antenna.

Although an IMD element has been studied and represented in the appended figures, the antenna element is may be any antenna element that is not an isolated magnetic dipole antenna. The antenna element or elements can be a monopole, dipole, inverted F antenna (IFA), Planar F antenna (Pifa), or loop. The invention is not restricted to the antenna types listed above.

The antenna can be configured such that two asymmetric frequency responses are generated, with the first frequency response being lower in frequency compared to the second frequency response. An asymmetric roll-off in frequency above the resonant frequency for the first frequency response is generated, and an asymmetric roll-off in frequency below the resonant frequency for the second frequency response is generated. This antenna system provides improved frequency discrimination between the two frequency responses.

Figure 1B:
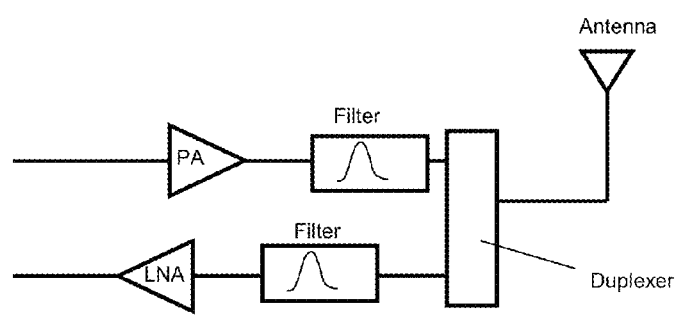
FIG. 1b illustrates an antenna and front end architecture.

FIG. 1 illustrates a plot of radiated efficiency from a transceiver, showing the in-band radiated efficiency and the slope of efficiency at out-of-band frequencies. A block diagram of a transceiver circuit is shown, with the filter and antenna element shown. The filter and antenna will be dominant contributors for both in-band and out-of-band efficiency response from the circuit.

Figure 2A:
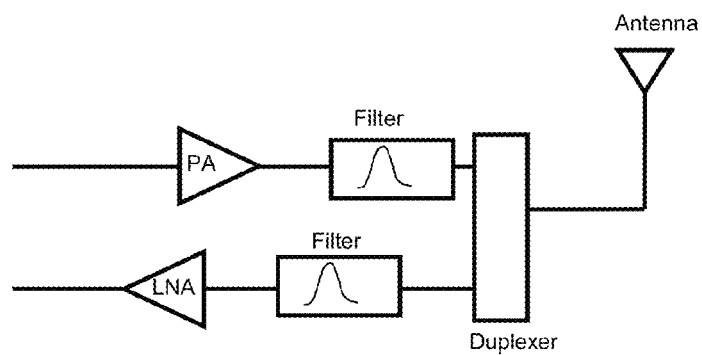
FIG. 2a illustrates an antenna and front end architecture.
Figure 2B:
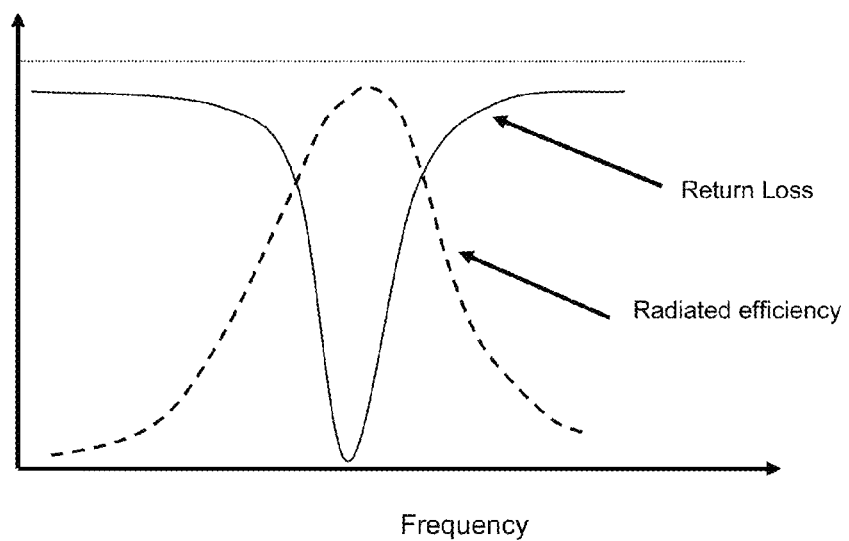

FIG. 2 illustrates an example of return loss and insertion loss of the transceiver circuit shown. At the frequencies of operation the insertion loss is minimal, with the roll-off in the performance of the circuit shown as an increase in both return loss and insertion loss at out-of-band.

Figure 3:
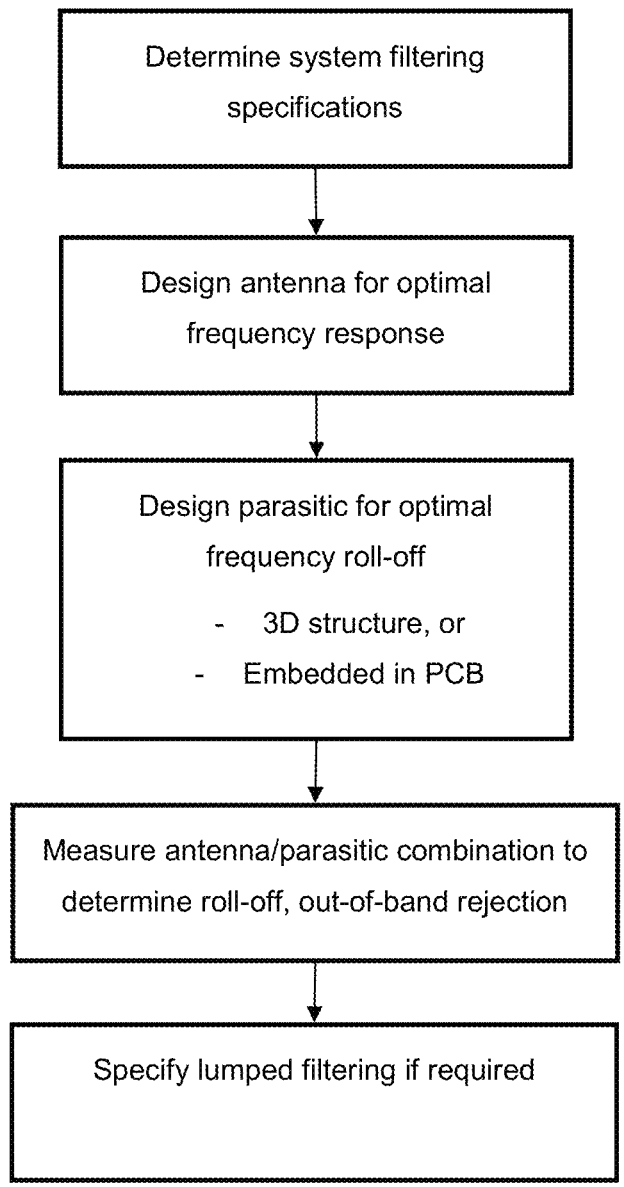
FIG. 3 illustrates a two pole passive filter design methodology.

FIG. 3 illustrates an example of a flowchart describing the design of a passive multimode antenna and filter assembly. The technique places emphasis on improved filtering from the multimode antenna to reduce or eliminate requirements for a filter.

Figure 4:
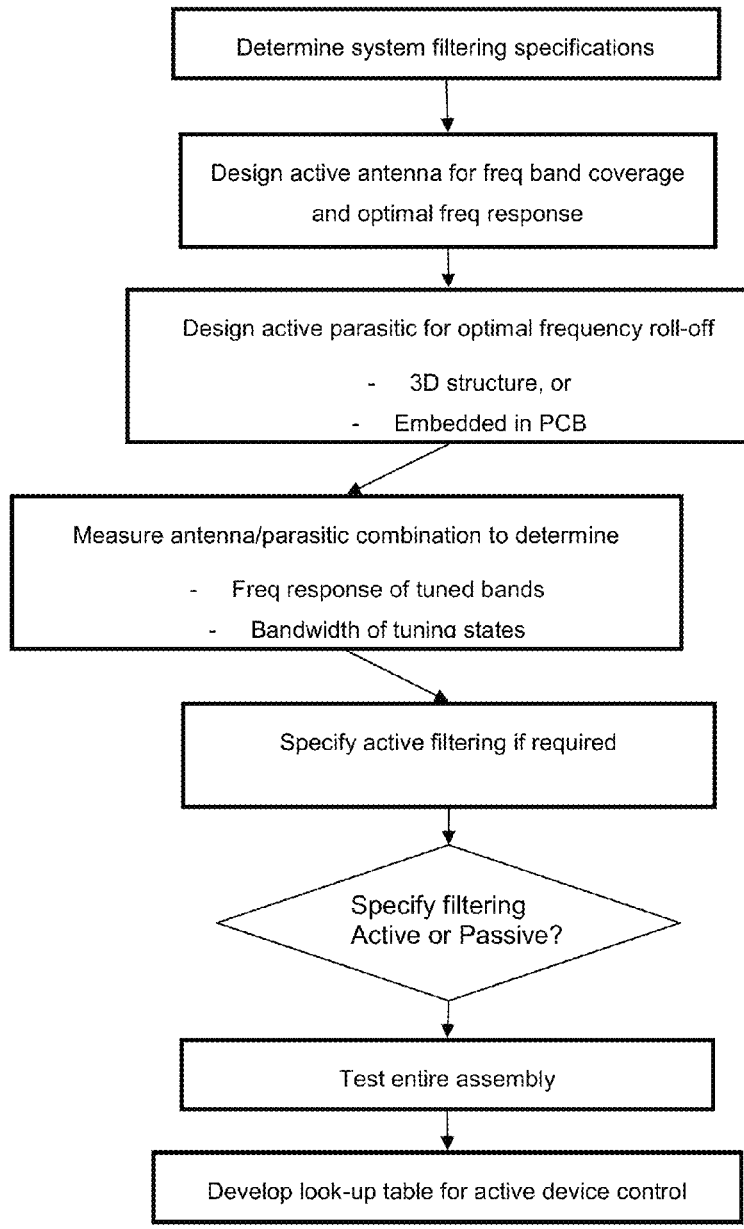
FIG. 4 illustrates a two pole active filter design methodology in accordance with embodiments herein.

FIG. 4 illustrates an example of a flowchart describing the design of an active multimode antenna and filter assembly. The technique places emphasis on improved filtering from the active multimode antenna to reduce or eliminate requirements for a filter. The active multimode antenna with passive or active filter will provide improved out-of-band rejection compared to a passive antenna and passive filter.

Figure 5:
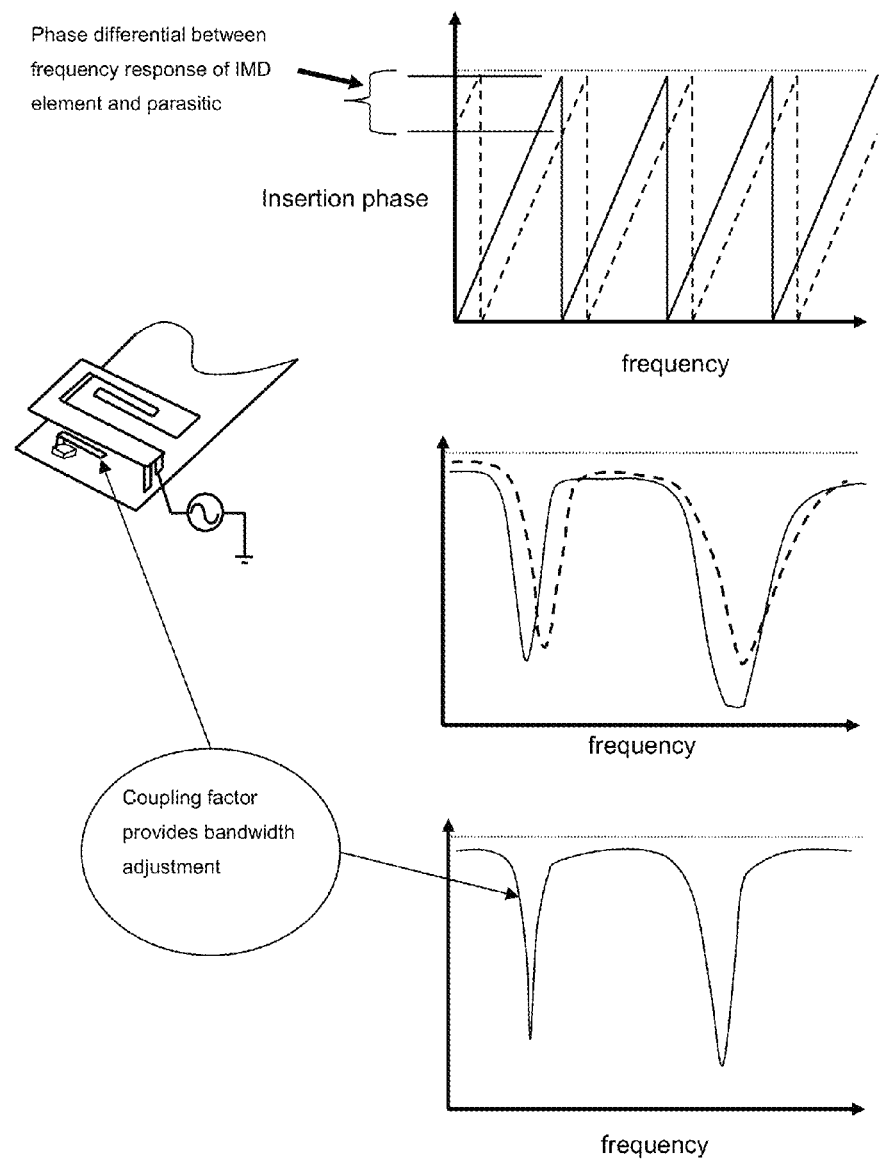
FIG. 5 illustrates a frequency response of an antenna element, that of a parasitic element, a phase difference therebetween, and a combined frequency generated by the antenna and parasitic elements together.

FIG. 5 illustrates factors that are modified to alter filtering characteristics of the multimode antenna. Phase offset is chosen to form a phase differential to between filter sections to control slope of the filter response. The coupling factor Cf, which is the coupling between the IMD element and the parasitic, is chosen to adjust the frequency response of both the IMD element and parasitic element filter sections. The bandwidth of the composite filter response is also adjusted by the coupling factor.

Figure 6:
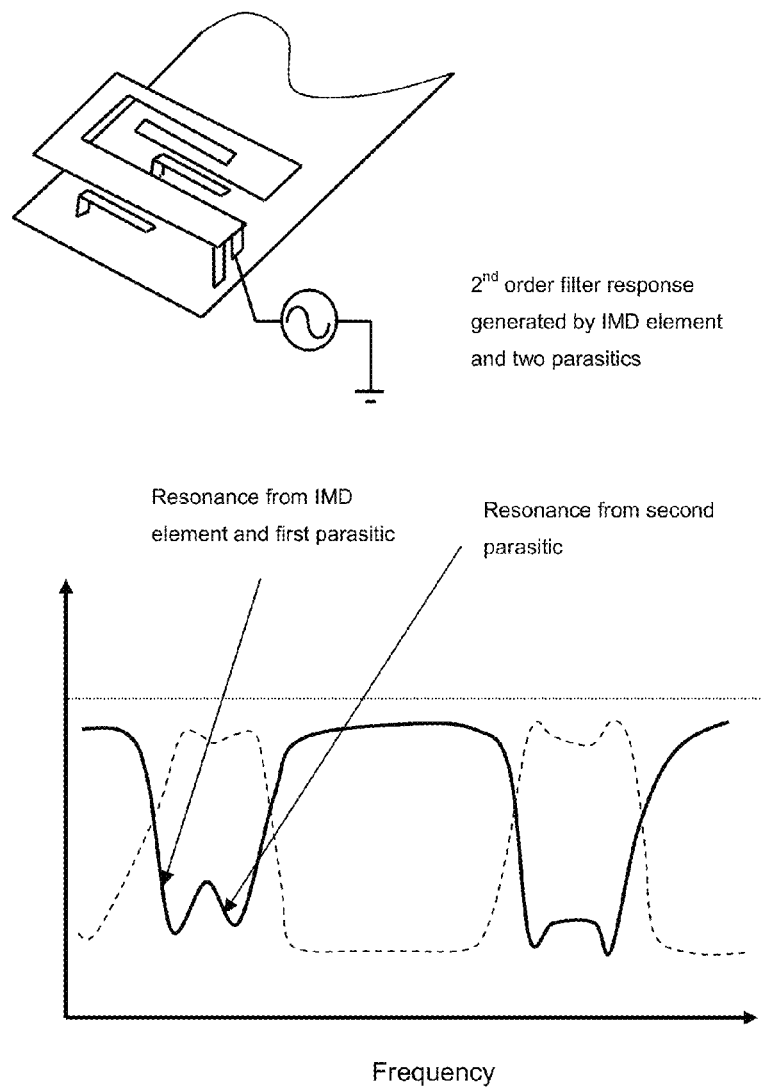
FIG. 6 illustrates a second order filter response generated by an antenna element and two parasitic elements of an antenna system in accordance with an embodiment herein; a plot illustrates the resulting resonances.

FIG. 6 illustrates an example of a 2nd order filter formed by an IMD element and two parasitic elements. A first filter section is formed by merging the frequency responses of the IMD element and the first parasitic, with the second filter section formed by the second parasitic.

Figure 7:
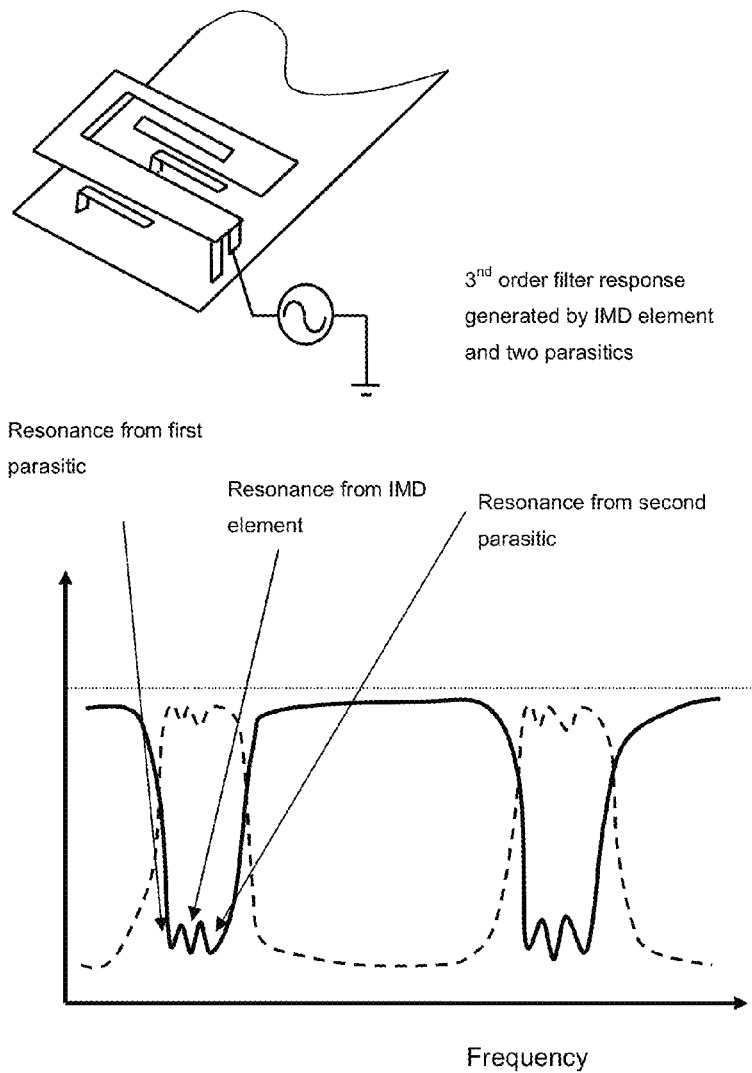
FIG. 7 illustrates a third order filter response generated by an antenna element and two parasitic elements; a plot illustrates the resulting resonances.

FIG. 7 illustrates an example of a 3rd order filter formed by an IMD element and two parasitics. A first filter section is formed by the IMD element, a second filter section is formed by the first parasitic, and a third filter section is formed by the second parasitic.

Figure 8:
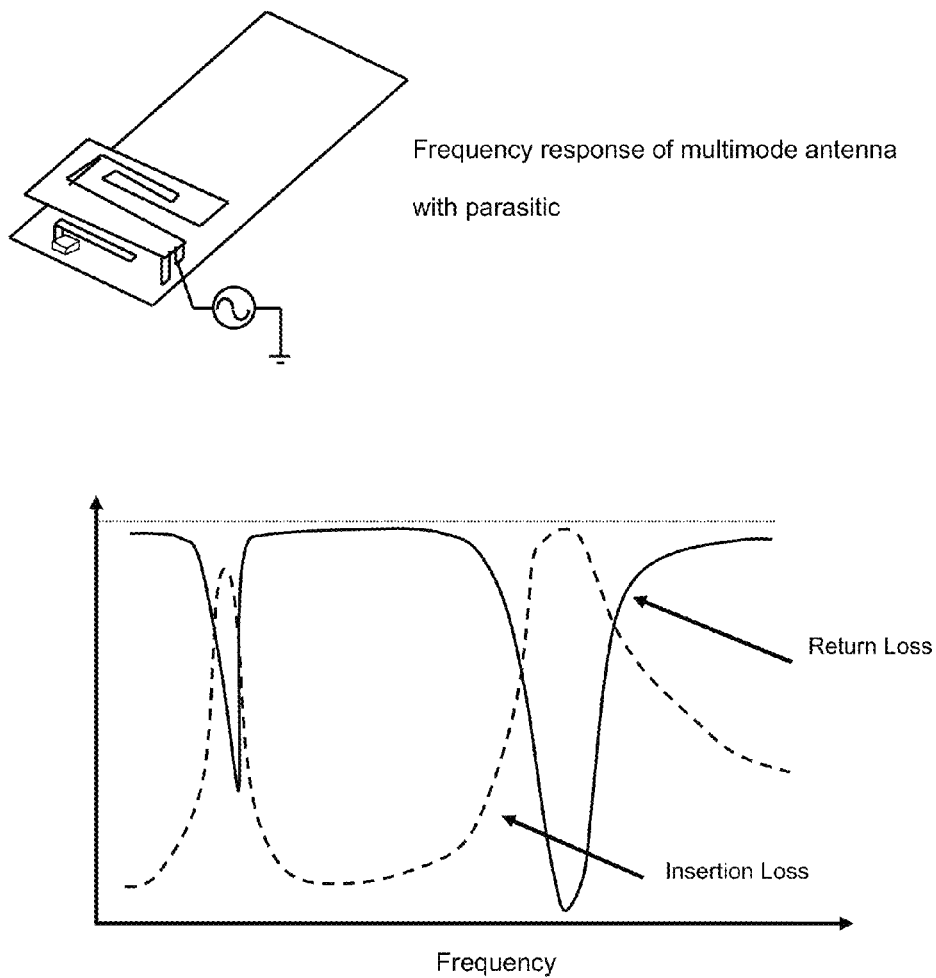
FIG. 8 illustrates a frequency response of an active modal antenna with a parasitic element positioned adjacent to an antenna element; a plot illustrates the resulting resonances.

FIG. 8 illustrates an example of a dual resonance frequency response generated by a multimode antenna system. The lower frequency resonance is generated by the parasitic, with the upper frequency resonance formed by the IMD element.

Figure 9:
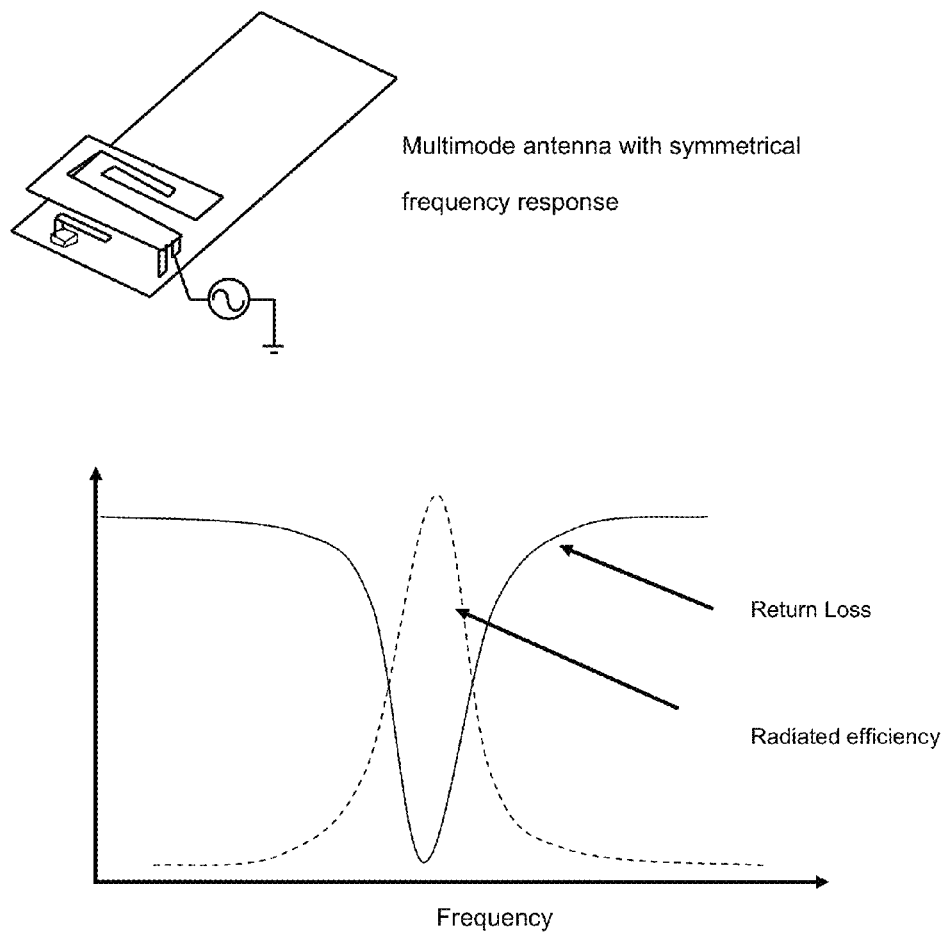
FIG. 9 illustrates a multimode antenna with a symmetrical frequency response and a resulting plot illustrating the return loss and radiated efficiency.

FIG. 9 illustrates an example of a single resonance frequency response generated by a multimode antenna system. The resonances of the IMD element and parasitic are adjusted to form a single resultant frequency response, with symmetrical roll-off.

Figure 10:
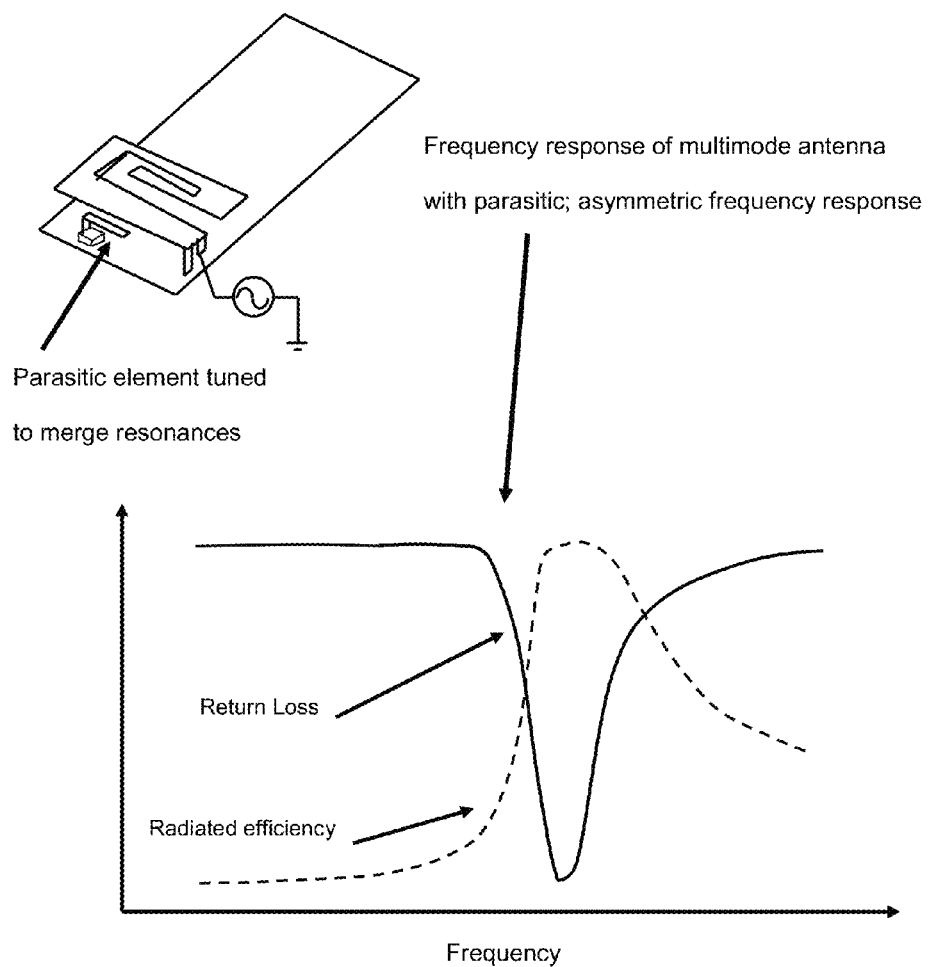
FIG. 10 illustrates an asymmetric frequency response of an active modal antenna with a parasitic element tuned to merge resonances.

FIG. 10 illustrates an example of a single resonance frequency response generated by a multimode antenna system. The resonances of the IMD element and parasitic are adjusted to form a single resultant frequency response, with asymmetrical roll-off. Precise tuning of the parasitic sets the frequency response provide asymmetric roll-off on the lower frequency or higher frequency skirt.

Figure 11:
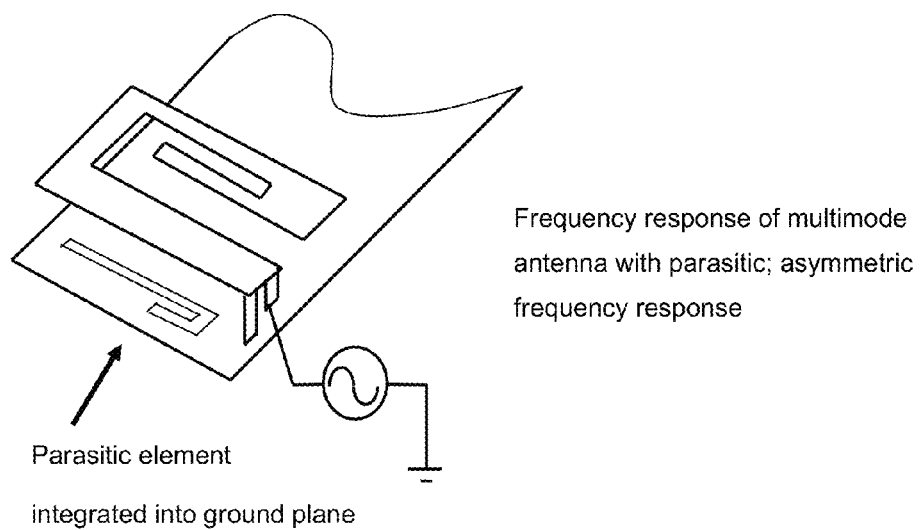
FIG. 11 illustrates a frequency response of an active modal antenna with a parasitic element integrated into the ground plane.
Figure 11:
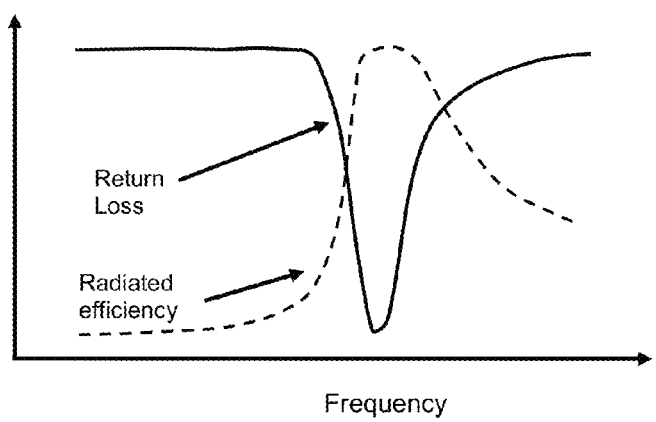

FIG. 11 illustrates an example of a multimode antenna system with improved filtering performance formed using an IMD element and a parasitic element. The parasitic element is a slot embedded in the ground plane underneath or in the vicinity of the IMD element. An asymmetric frequency response is shown, but both symmetric and asymmetric frequency responses can be implemented.

Figure 12:
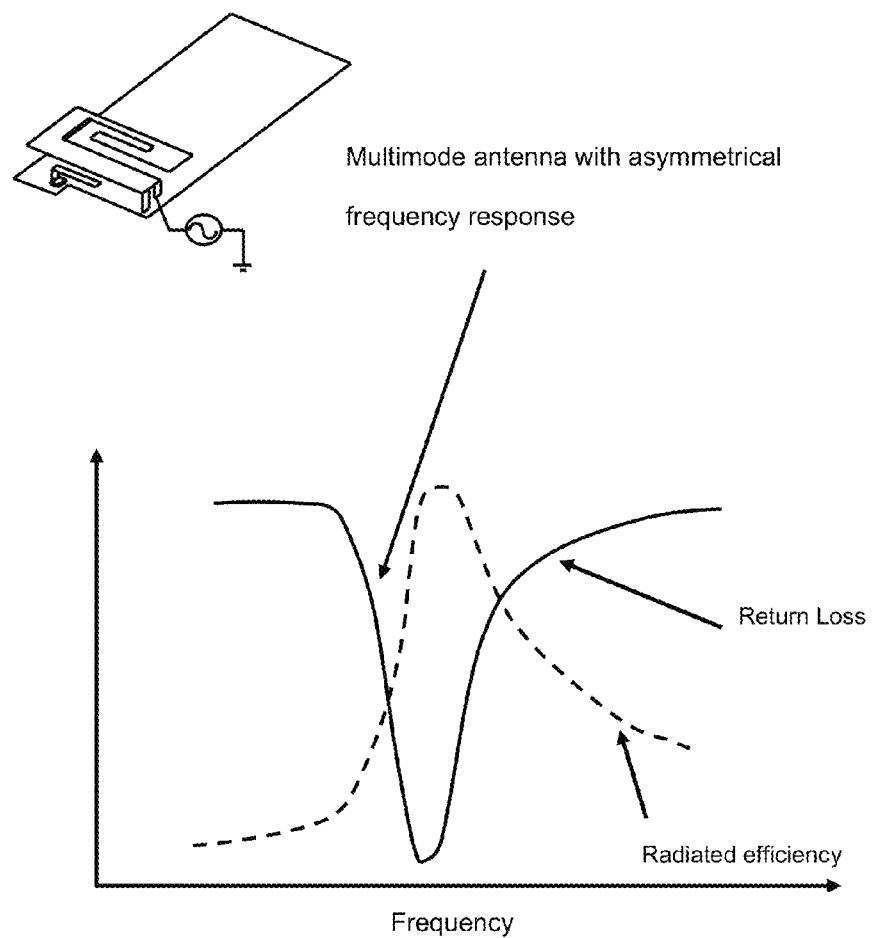
FIG. 12 illustrates a frequency response of an active modal antenna with a portion of the ground plane removed beneath the antenna radiator.

FIG. 12 illustrates an example of a multimode antenna system with partial ground plane removal underneath the IMD element. The parasitic is positioned to interact with the truncated ground plane to form an asymmetrical frequency response.

Figure 13A:
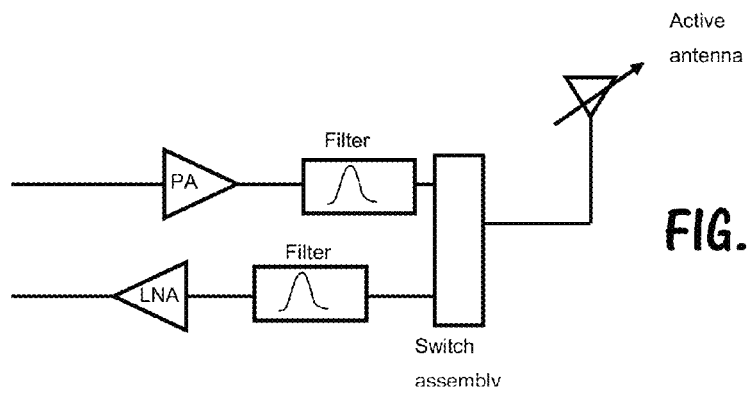
FIG. 13a illustrates an antenna front end architecture with passive filters in the antenna front end and an active modal antenna coupled therewith.
Figure 13B:
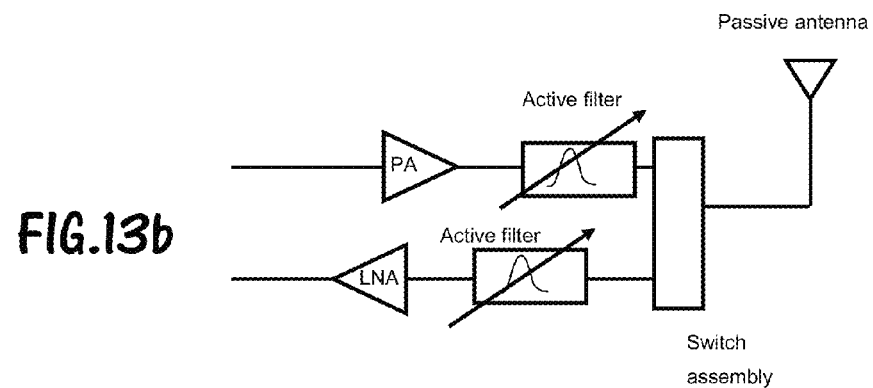
FIG. 13b illustrates an antenna front end architecture with active filters in the antenna front end and a passive antenna coupled therewith.
Figure 13C:
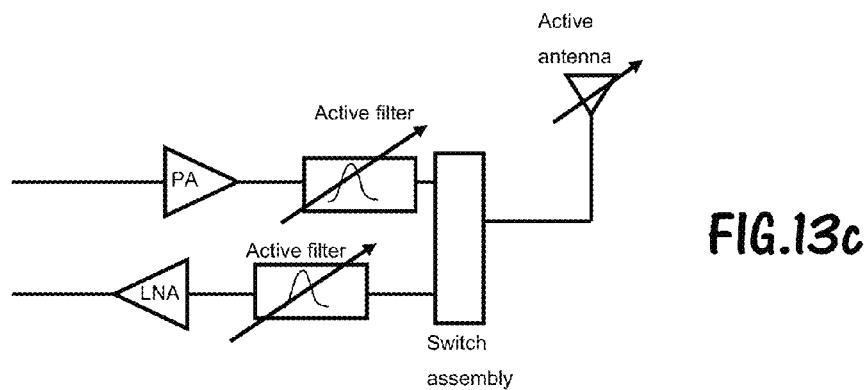
FIG. 13c illustrates an antenna front end architecture with active filters in the antenna front end and an active modal antenna coupled therewith.

FIG. 13 illustrates examples of multimode antenna and discrete filter pairs implemented in RF circuits. The combinations of passive filter and active multimode antenna, active filter and passive multimode antenna, and active filter and active multimode antenna are illustrated.

Figure 14:
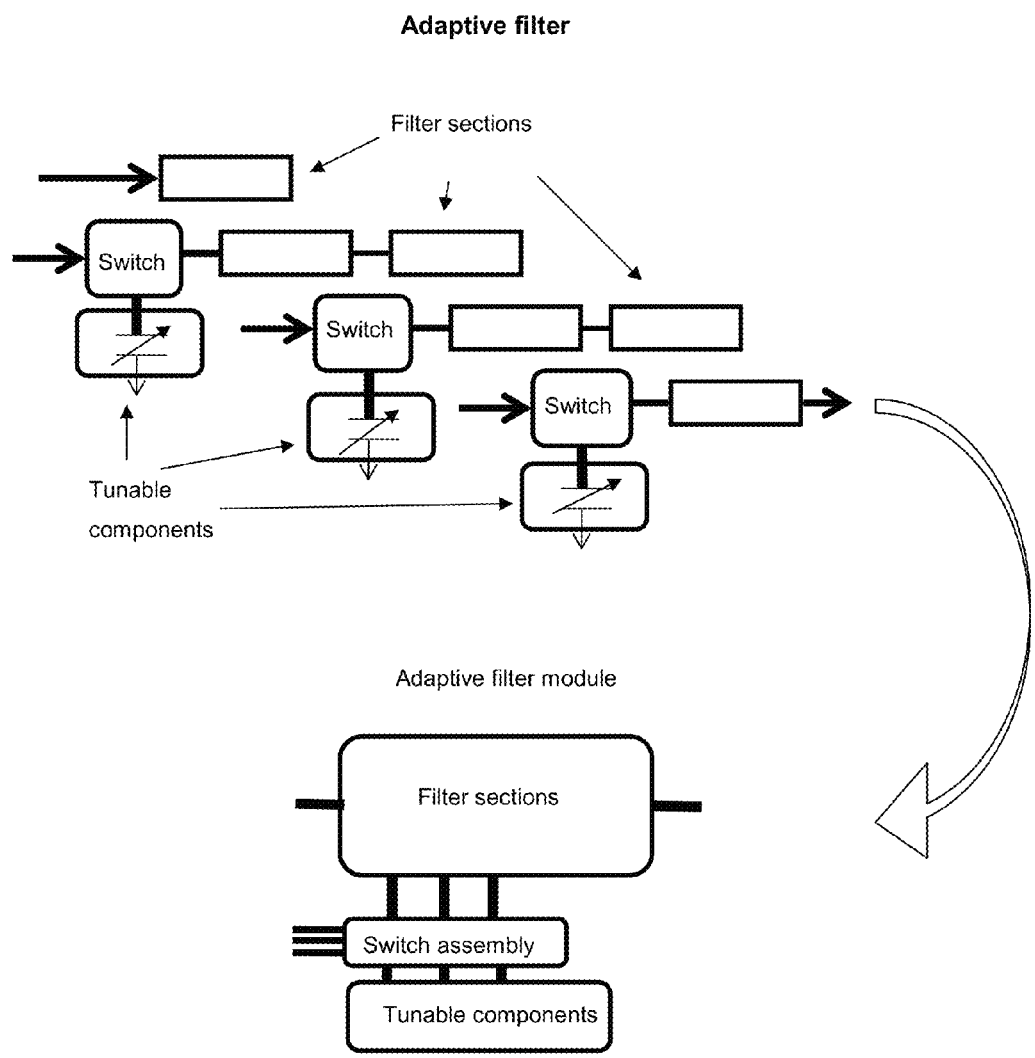
FIG. 14 illustrates an active filter topology and related module.

FIG. 14 illustrates an example of an active filter module. Filter sections, a switch assembly, and tunable matching components are combined to provide dynamic tuning and adjustment of the filter response.

Figure 15:
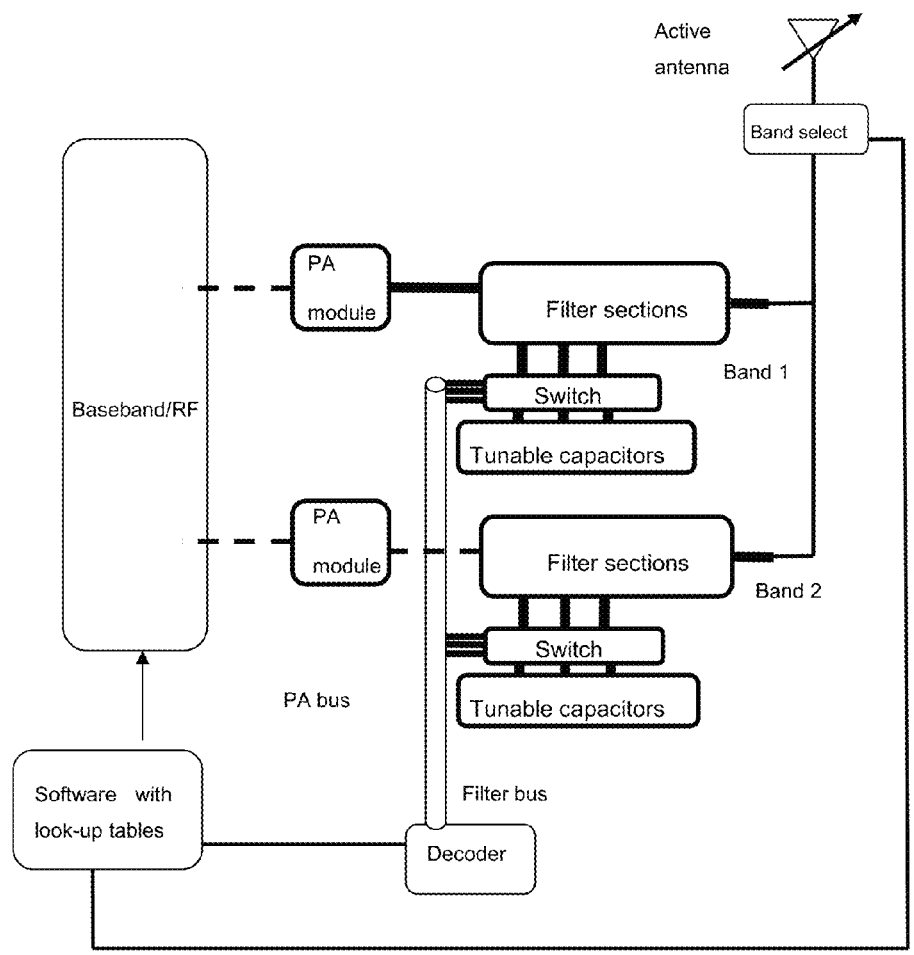
FIG. 15 illustrates a dynamically tunable multimode antenna and active filter implemented in a front end module (FEM).

FIG. 15 illustrates an example of a dynamically tunable multimode antenna and active filter implemented in a front end module (FEM). Software is used to synchronize and the active filter modules and the active multimode antenna. The filtering characteristics of the active filter and active multimode antenna are adjusted in unison to provide optimal system filtering.

Figure 16:
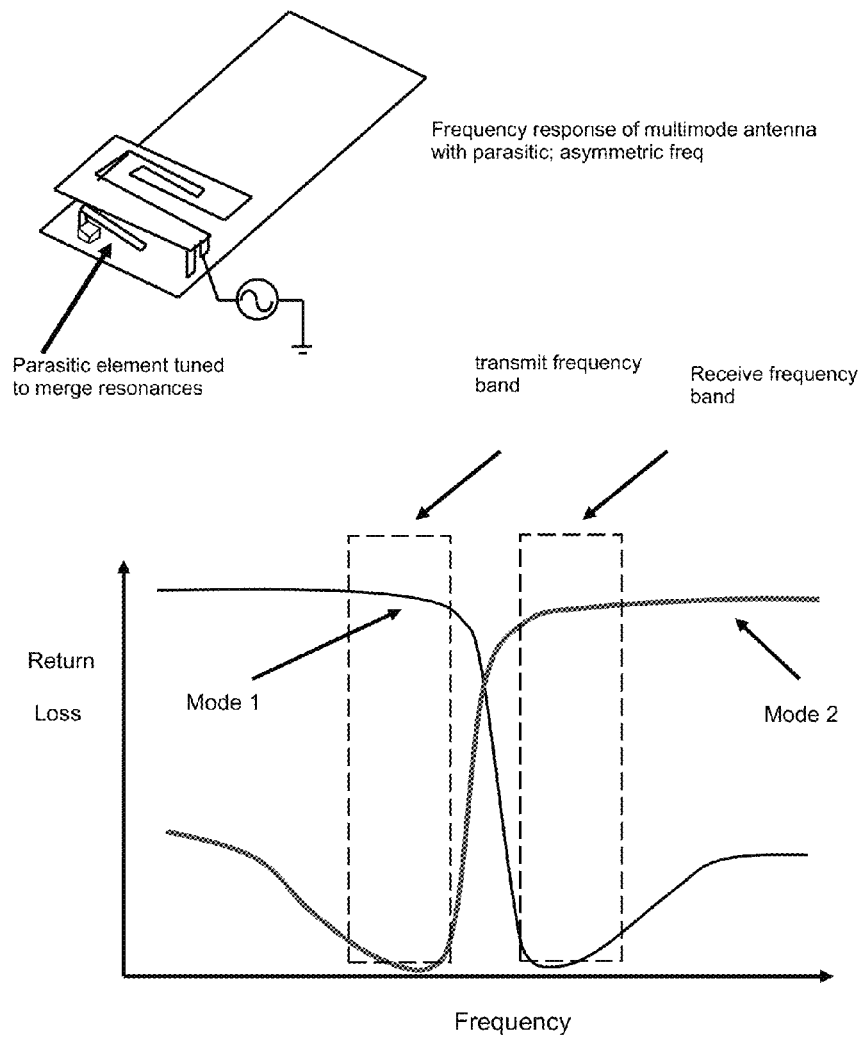
FIG. 16 illustrates an active multimode antenna with two tuning states.

FIG. 16 illustrates an example of an active multimode antenna with two tuning states. The two tuning states are adjusted to provide filtering to separate transmit and receive bands in a Time Division Multiplex (TDM) system.

Figure 17:
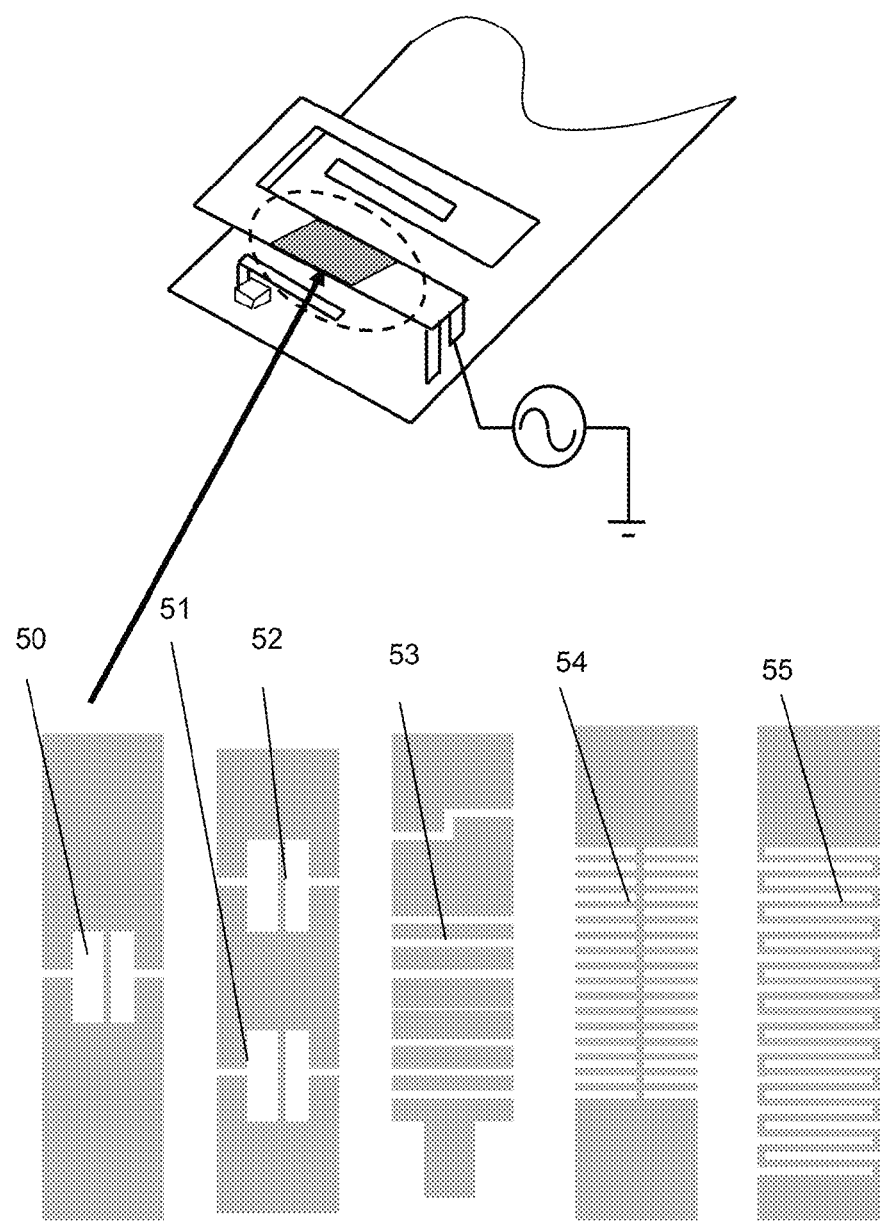
FIG. 17 illustrates several types of conductive elements with distributed reactance incorporated into the element at respective filtering sections.

FIG. 17 shows several types of conductive elements with distributed reactance incorporated into the element at respective filtering sections 50-55, respectively. The distributed reactance can be adjusted to alter the frequency response of the conductive element. These conductive patterns can be designed into the IMD element or the parasitic.

What is claimed is:

1. An active modal antenna adapted for enhanced filtering of signals, comprising:
    an antenna element positioned above a circuit board forming an antenna volume therebetween;
    a parasitic element positioned adjacent to the antenna element; and
    an active control element coupled to the parasitic element and configured to vary a reactance thereon;
    the antenna element adapted to generate a frequency response having one or more resonances thereof;
    wherein the parasitic element is positioned relative to the antenna element for providing transmission and reception of signals in a desired frequency band and rejecting signals outside of the desired frequency band.

2. The active modal antenna of claim 1, wherein the parasitic coupled to the active control element provides a mechanism for adjusting the frequency response of the parasitic to merge with the frequency response of the antenna element to form a resultant asymmetric frequency response.

3. The active modal antenna of claim 1, further coupled to an active filter, wherein the active filter is adapted to receive control signals from a baseband processor and actively filter one or more radiofrequency signals.

4. The active modal antenna of claim 3, the active filter being adapted to minimize insertion loss through the filter by reducing frequency rejection requirements thereof.

5. The active modal antenna of claim 1, wherein an area of the circuit board spans an area of the antenna element.

6. The active modal antenna of claim 1, wherein the antenna is coupled to one or more passive filters.

7. The active modal antenna of claim 1, wherein the antenna element comprises one or more filtering sections disposed thereon.

* * * * *